United States Patent
Guerin et al.

(10) Patent No.: US 9,241,413 B2
(45) Date of Patent: Jan. 19, 2016

(54) DEVICE FOR ASSEMBLING CAPACITORS FOR AN ELECTRONIC CONVERTER

(71) Applicant: VALEO EQUIPMENTS ELECTRIQUES MOTEUR, Creteil (FR)

(72) Inventors: Fabien Guerin, Chatillon (FR); Alexis Hosni, Paris (FR)

(73) Assignee: Valeo Equipements Electriques Moteur, Creteil Cedex (FR)

( * ) Notice: Subject to any disclaimer, the term of this patent is extended or adjusted under 35 U.S.C. 154(b) by 60 days.

(21) Appl. No.: 14/370,926

(22) PCT Filed: Dec. 19, 2012

(86) PCT No.: PCT/FR2012/053000
§ 371 (c)(1),
(2) Date: Jul. 7, 2014

(87) PCT Pub. No.: WO2013/102720
PCT Pub. Date: Jul. 11, 2013

(65) Prior Publication Data
US 2014/0321090 A1    Oct. 30, 2014

(30) Foreign Application Priority Data
Jan. 5, 2012   (FR) ...................................... 12 50103

(51) Int. Cl.
*H05K 3/30*    (2006.01)
*H05K 1/18*    (2006.01)
(Continued)

(52) U.S. Cl.
CPC ................. *H05K 3/301* (2013.01); *H01G 9/26* (2013.01); *H02M 7/003* (2013.01); *H05K 1/181* (2013.01);
(Continued)

(58) Field of Classification Search
CPC ........... H05K 3/301; H05K 3/30; H05K 7/06; H05K 7/03; H05K 1/181; H05K 1/18; H05K 7/1432; H01G 9/26; H02M 7/003; Y10T 29/49169; Y02T 10/7022
USPC ...... 174/72 B, 68.2, 71 B, 88 B, 99 B, 129 B, 174/133 B, 149 B, 70 B; 361/611, 271, 361/301.1, 321.3, 637, 648, 763, 766, 775
See application file for complete search history.

(56) References Cited

U.S. PATENT DOCUMENTS 6,822,850 B2 * 11/2004 Pfeifer ................ H02M 7/0003
                                                          361/611
6,885,553 B2 *  4/2005 Pfeifer .................. H02M 7/003
                                                          361/624
(Continued)

FOREIGN PATENT DOCUMENTS

DE    102005018172    10/2006
EP         1143603    10/2001
(Continued)

*Primary Examiner* — Angel R Estrada
(74) *Attorney, Agent, or Firm* — Berenato & White, LLC

(57) ABSTRACT

The device (100) for assembling capacitors (200) is intended for an electronic converter with a plurality of arms provided with transistors. The device comprises a bus bar (11) with positive polarity and a bus bar (12) with negative polarity. The bus bar with positive polarity and the bus bar with negative polarity are superposed one on top of the other without electrical contact. Preferably, the bus bar with positive polarity comprises a width (L1) smaller than the width (L2) of the bus bar with negative polarity. The device further comprises a support part (13) for insulating and indexing, arranged between the bus bar with positive polarity and the bus bar with negative polarity. The support part for insulating and indexing is typically formed from PBT plastic material reinforced with fiberglass.

21 Claims, 10 Drawing Sheets

(51) Int. Cl.
  *H05K 7/06*  (2006.01)
  *H02M 7/00*  (2006.01)
  *H05K 7/14*  (2006.01)
  *H01G 9/26*  (2006.01)

(52) U.S. Cl.
  CPC ............... *H05K 7/06* (2013.01); *H05K 7/1432* (2013.01); *Y02T 10/7022* (2013.01); *Y10T 29/49169* (2015.01)

(56) References Cited

U.S. PATENT DOCUMENTS

| | | | | |
|---|---|---|---|---|
| 6,956,742 B2 * | 10/2005 | Pfeifer | ................. | H02M 7/003 361/710 |
| 8,243,447 B2 * | 8/2012 | Fujiki | ................. | H05K 7/20909 361/714 |
| 8,902,612 B2 * | 12/2014 | Inuduka | ................. | H02M 7/003 361/830 |
| 9,042,112 B2 * | 5/2015 | Guan | ................... | H05K 7/1432 361/763 |
| 2010/0000089 A1 | 1/2010 | Yang et al. | | |
| 2011/0304948 A1 | 12/2011 | Lee et al. | | |

FOREIGN PATENT DOCUMENTS

| | | |
|---|---|---|
| EP | 1174992 | 1/2002 |
| GB | 2242580 | 10/1991 |
| WO | 2011/065005 | 6/2011 |

* cited by examiner

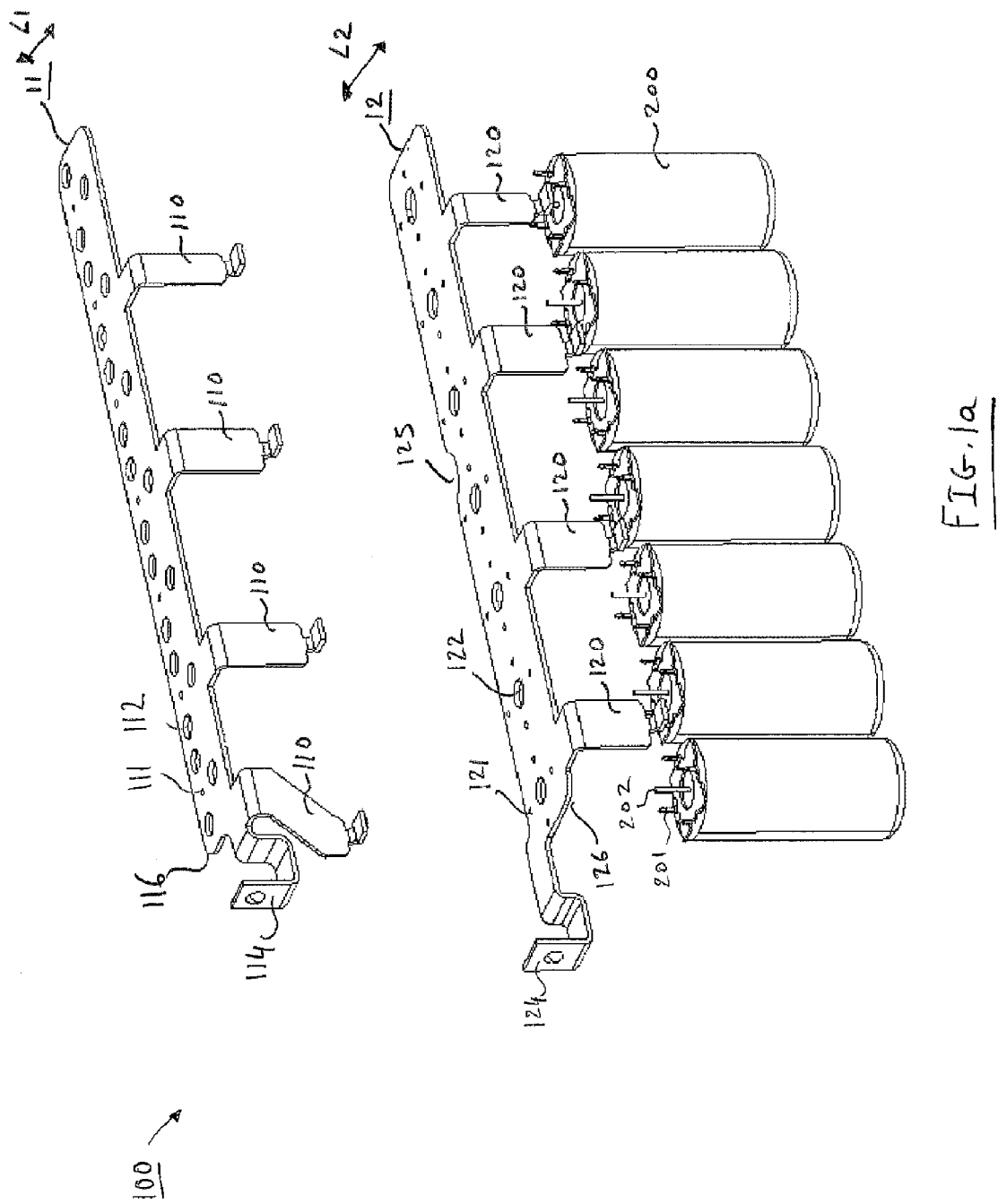

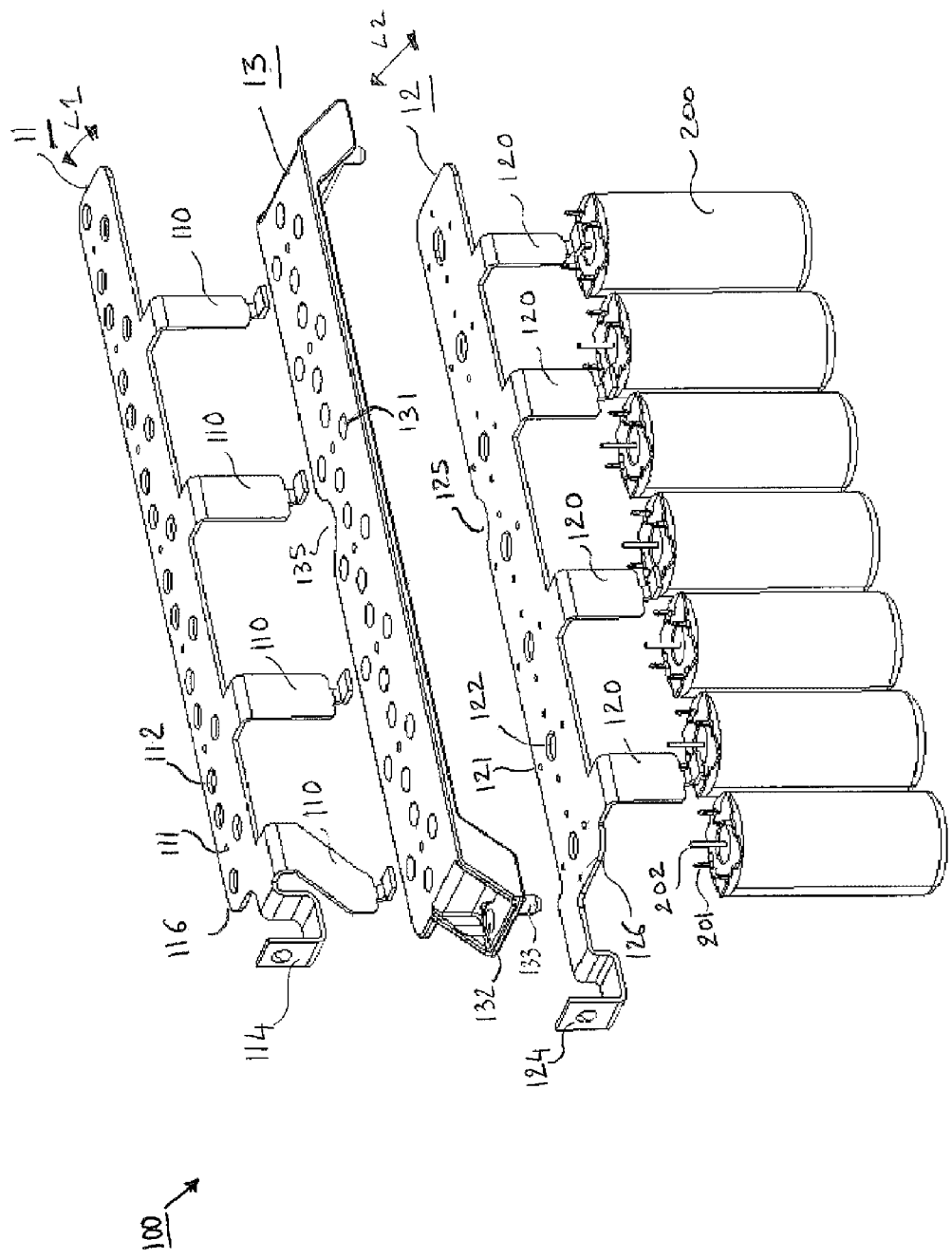

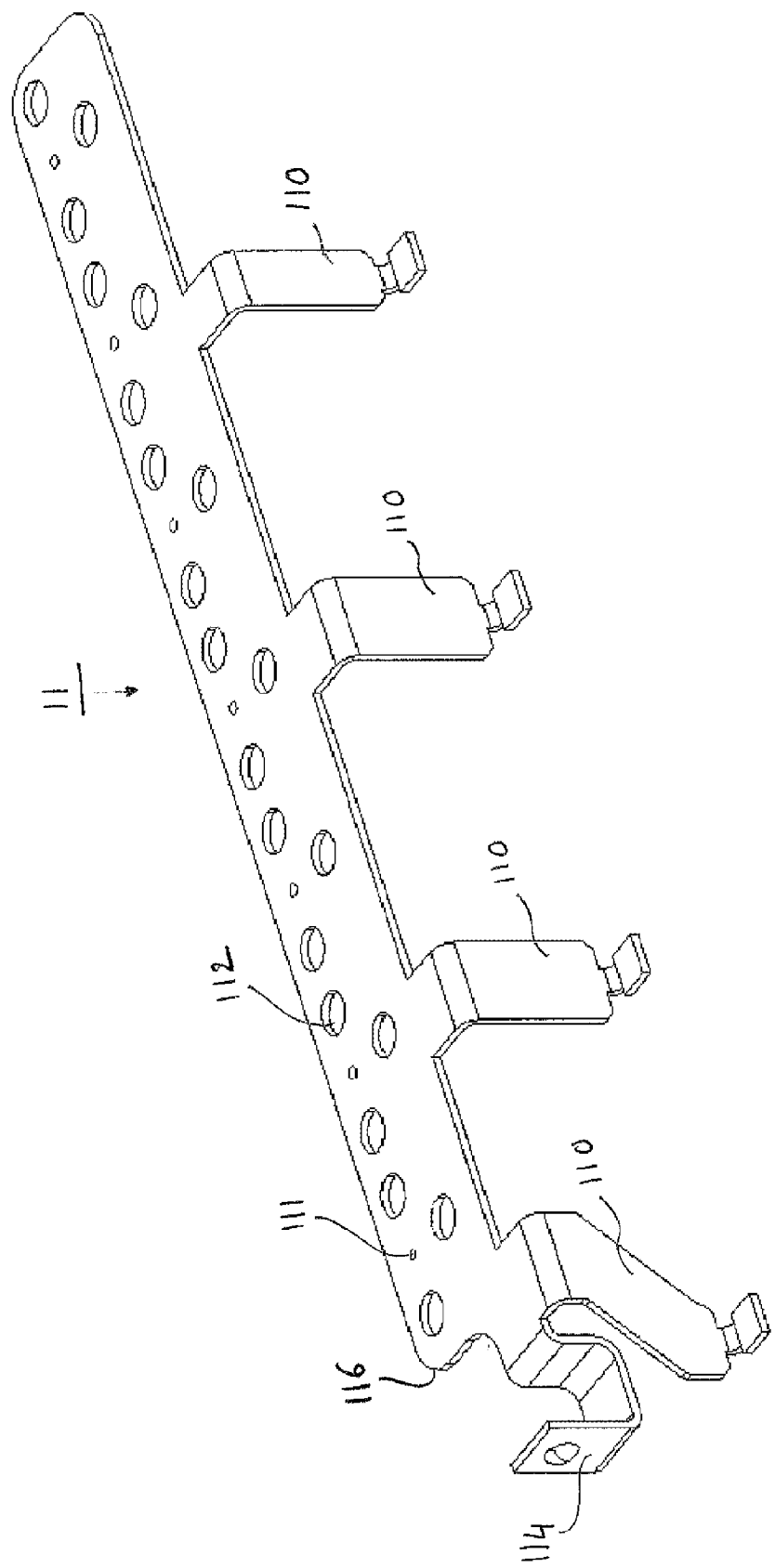

DEVICE FOR ASSEMBLING CAPACITORS FOR AN ELECTRONIC CONVERTER

CROSS-REFERENCE TO RELATED APPLICATIONS AND CLAIM TO PRIORITY

This application is a national stage application of International Application No. PCT/FR2012/053000 filed Dec. 19, 2012, which claims priority to French Patent Application No. 1250103 filed Jan. 5, 2012, of which the disclosures are incorporated herein by reference and to which priority is claimed.

TECHNICAL FIELD OF THE INVENTION

The present invention relates to a device for assembling capacitors for an electronic converter, comprising a plurality of arms provided with transistors.

The present invention also relates to an electronic converter comprising a device for assembling of this type.

Its application is in particular, but not exclusively, in the field of electronic converters of motor vehicle electrical machines.

TECHNOLOGICAL BACKGROUND OF THE INVENTION

Conventionally, an electronic converter comprises a printed circuit board commonly known as a PCB board, the said PCB board comprising the electronic components which form the electric circuit of the converter, i.e. capacitors, an integrated circuit, discrete electronic components and conductive traces in order to distribute the current through the electric circuit etc. The PCB board is conventionally formed from an assembly of one or a plurality of fine layers of copper separated by an insulating material. The layers of copper are etched by means of a chemical process in order to obtain the assembly of conductive traces (also known as tracks) which end in pads. The traces are often covered with a layer of coloured varnish which makes it possible to protect the tracks against oxidation and any short-circuits.

According to a prior art well known to persons skilled in the art, the capacitors are welded directly on the PCB board, and connected to the conductive traces by means of the pads.

A disadvantage of this prior art consists of the fact that, since the thickness of the layer(s) of copper is slight, it is difficult to use an electronic converter of this type in the case of applications which require strong currents, for example of approximately 50 A. In addition, since the traces are positioned adjacent to one another, this creates strong inductance which can disrupt the functioning of the electric circuit.

In this context, the object of the present invention is to eliminate the aforementioned disadvantages.

GENERAL DESCRIPTION OF THE INVENTION

The invention relates to a device for assembling capacitors for an electronic converter, comprising a plurality of arms provided with transistors, the said device for assembling comprising a bus bar with positive polarity comprising a plurality of supply lugs, each supply lug being designed to be connected to a positive electrode of each arm of the said electronic converter, and a bus bar with negative polarity comprising a plurality of supply lugs, each supply lug being designed to be connected to a negative electrode of each arm of the said electronic converter, the bus bar with positive polarity and the bus bar with negative polarity being superimposed on one another without electrical contact.

According to the invention, the bus bar with positive polarity also comprises at least a first positioning orifice which is designed to receive a positive pin of a capacitor, and is designed to provide an electrical connection with the said positive pin, and at least a first clearance orifice which is designed to allow a negative pin of a capacitor to pass through the said bus bar with positive polarity without electrical contact, and the bus bar with negative polarity also comprises a second clearance orifice which is designed to allow a positive pin of a capacitor to pass through the said bus bar with negative polarity without electrical contact, and at least a second positioning orifice which is designed to receive a negative pin of a capacitor, and is designed to provide an electrical connection with the said negative pin, and the device additionally comprises a support part for insulation and indexing which is arranged between the said bus bar with positive polarity and the said bus bar with negative polarity, the said support part comprising at least a first part for indexing of the said support part with the bus bar with negative polarity, and at least one clearance orifice which is designed to allow a negative pin of a capacitor to pass through the said support part without electrical contact.

Thus, the device for assembling according to the invention makes it possible to provide an assembly of capacitors for an electronic converter of a motor vehicle using bus bars which are independent from the electric circuit of the converter, instead of conductive tracks, for applications with a strong current, and thus makes it possible to reduce the inductance of the current conductor systems (i.e. the bus bars) by means of their arrangement.

In addition to the main characteristics which have just been described in the preceding paragraph, the device for assembling capacitors for an electronic converter of a motor vehicle according to the invention can have one or more of the following additional characteristics, considered individually or according to all the combinations technically possible:

The bus bar with positive polarity comprises a width which is smaller than the width of the bus bar with negative polarity.

The device for assembling is designed to be arranged in a vessel, and the support part for insulation and indexing additionally comprises:

a second part for indexing of the said device for assembling with the said vessel.

an orifice for securing of the said device for assembling in the said vessel.

The bus bar with negative polarity and the support part for insulation and indexing comprise a clearance in order to receive a flow of electrical insulation in receptacles in the vessel, such as to render the capacitors integral with the said vessel.

The bus bar with negative polarity additionally comprises a polarisation function, in order to ensure the installation of the bus bar with negative polarity on the support part for insulation and indexing.

The support part for insulation and indexing is formed by a composite material formed from PBT plastic material filled with glass fibre.

The invention also relates to an electronic converter comprising a plurality of arms provided with transistors, according to which the electronic converter comprises:

a device for assembling according to any one of the preceding characteristics;

a plurality of capacitors designed to be assembled by the device for assembling;

a printed circuit board which forms the electric circuit of the said electronic converter, the said printed circuit board comprising the plurality of arms provided with transistors.

In a first non-limiting embodiment, the electronic converter is an inverter for an electrical machine.

In a second non-limiting embodiment, the electronic converter is a two-way DC/DC converter.

BRIEF DESCRIPTION OF THE FIGURES

Other characteristics and advantages of the invention will become clearly apparent from the description provided hereinafter by way of indication which is in no way limiting, with reference to the appended figures:

FIG. 1a represents an exploded view in perspective of a first non-limiting embodiment of a device for assembling capacitors for an electronic converter of a motor vehicle according to the invention;

FIG. 1b represents an exploded view in perspective of a second non-limiting embodiment of a device for assembling capacitors for an electronic converter of a motor vehicle according to the invention;

FIG. 2 represents a view in perspective of a first bus bar with negative polarity of the device for assembling in FIG. 1a or FIG. 1b;

FIG. 5a represents an assembled view of the device for assembling illustrated in FIG. 1a;

DESCRIPTION OF EMBODIMENTS OF THE INVENTION

Figure 3:
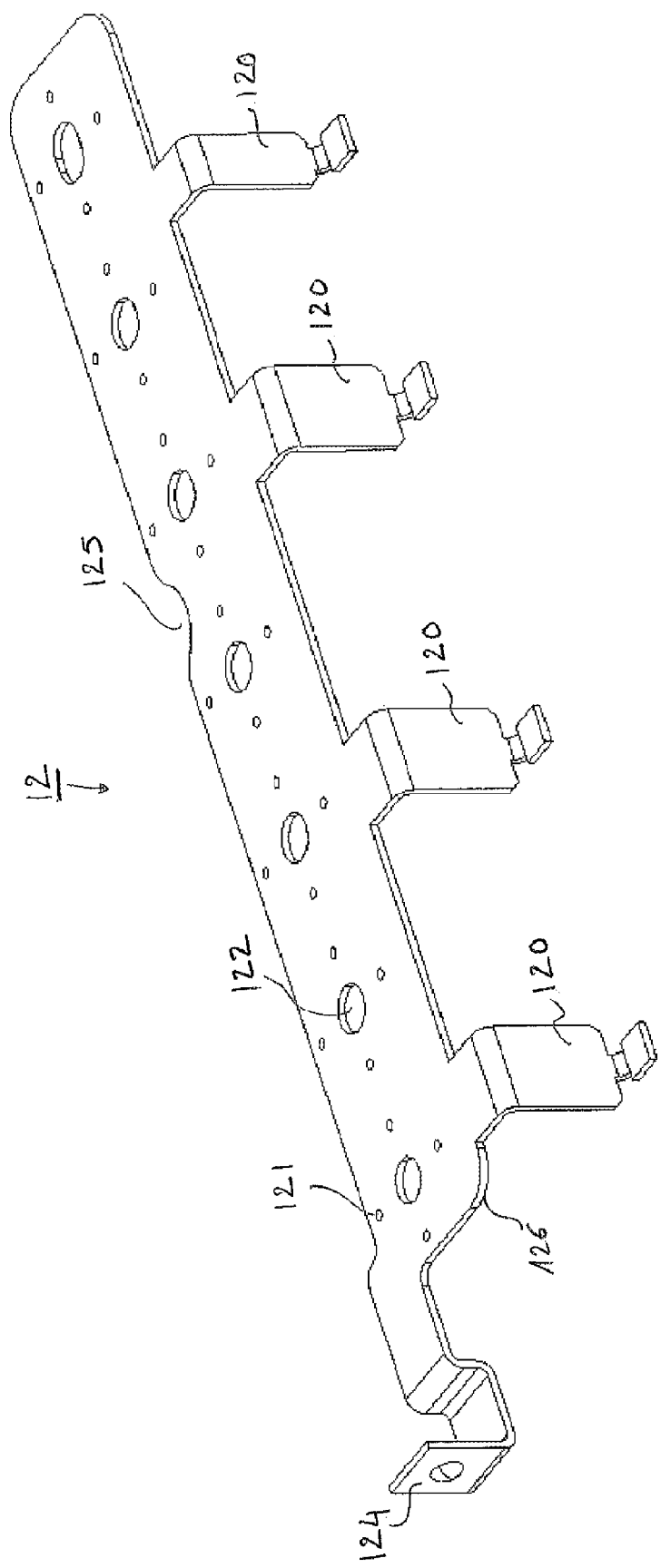
FIG. 3 represents a view in perspective of a second bus bar with positive polarity of the device for assembling in FIG. 1a or FIG. 1b.

Unless otherwise indicated, elements which are identical in terms of their structure or function retain the same references when shown in the different figures.

The device 100 for assembling of capacitors 200 for an electronic converter 300 comprising a plurality of arms 301 provided with transistors T is described with reference to FIGS. 1a to 7.

As illustrated in FIG. 1a, according to a first non-limiting embodiment, the device 100 for assembling comprises:
a bus bar with positive polarity 11 comprising:
a plurality of supply lugs 110, each supply lug being designed to be connected to a positive electrode of each arm 301 of the said electronic converter 300;
at least a first positioning orifice 112 which is designed to receive a positive pin 202 of a capacitor 200 and is designed to provide an electrical connection with the said positive pin 202;
at least a first clearance orifice 111 which is designed to allow a negative pin 201 of a capacitor 200 to pass through the said bus bar with positive polarity 11 without electrical contact;
a bus bar with negative polarity 12 comprising:
a plurality of supply lugs 120, each supply lug being designed to be connected to a negative electrode of each arm 301 of the said electronic converter 300;
a second clearance orifice 122 which is designed to allow a positive pin 202 of a capacitor 200 to pass through the said bus bar with negative polarity 12 without electrical contact;
at least a second positioning orifice 121 which is designed to receive a negative pin 201 of a capacitor 200 and is designed to provide an electrical connection with the said negative pin 201;
the bus bar with positive polarity 11 and the bus bar with negative polarity 12 being superimposed on one another without electrical contact.

Hereinafter in the description, the bus bar with positive polarity 11 will also be known as the positive bus bar. Similarly, the bus bar with negative polarity 12 will also be known as the negative bus bar.

Bus Bar with Positive Polarity

The positive bus bar 11 is also illustrated in FIG. 2.

It is a plate formed from copper or aluminium. According to a non-limiting embodiment, it can comprise additional tinning, so as to prevent oxidation of the copper.

In the example illustrated, the plate is designed such as to provide an assembly of the capacitors in an aligned configuration, so as to reduce the space occupied on the PCB board of the electronic converter 300. According to another embodiment, the plate can be designed such as to provide an assembly of the capacitors in a square configuration.

In the non-limiting example illustrated, the capacitors comprise a positive pin 202 and four negative pins 201. The capacitors are capacitors of the soldering stars type, i.e. axial capacitors which have a central pin with positive polarity 202, and in this case four peripheral pins with negative polarity 201.

Thus, the bus with positive polarity 11 comprises for each capacitor 200 which is designed to be assembled by the device for assembling:
a first positioning orifice 111; and
three first clearance orifices 112.

The first positioning orifice 111 makes it possible to insert the positive pin 202 of a capacitor correctly in the positive bus bar 11, and thus to be connected electrically to the positive bus bar 11 by electric welding. This first orifice can have slight fitting play in comparison with the diameter of a positive pin.

The first clearance orifices 112 have a diameter which is sufficient to allow the negative pins 201 of a capacitor 200 to pass through the said positive bus bar if these pins have a length which is longer than the thickness of the negative bus bar and if applicable the support part 13 (described hereinafter), such that when these pins reach the positive bus bar 11, they are not liable to be in connection with the latter. This therefore prevents a risk of short-circuiting. Thus, these orifices 112 make it possible to obtain a certain production tolerance at the level of the length of the negative pins 201 of the capacitors 200.

In addition, these apertures 112 make it possible to access the negative pins 201 in order to carry out welding of the said pins. These orifices 112 thus form a clearance in order to receive a welding meniscus during the welding of a pin, with a welding meniscus incorporating the edge effects of a weld. In general, the welding carried out is tin soldering.

It will be noted that the supply lugs 110 are positive supply lugs forming a positive electrode which makes it possible for them to be connected to a pad on the PCB board of each arm of an electronic converter 300. The connection is formed by means of the technique of brazing by electric re-fusion known as BRE. According to a non-limiting embodiment, the BRE technique uses an under-layer of nickel and tinning, which prevents oxidation during the powerful heating when the welding is carried out, and thus increases the quality and therefore the strength of the welding. Thus, by means of the lugs 410, the supply is brought as close as possible to each arm of the electronic converter 300. This therefore prevents the passage of the current through the electronic circuit which forms the electronic converter 300.

In addition, the positive bus bar 11 also comprises:

a polarisation function 116 which is ensured by asymmetry of form and in particular by means of a polarisation cut-out, in order to ensure the installation in the correct location of the positive bus bar 11 on the support part 13, i.e. above the said support part, and not below in the place of the negative bus bar 12. The so-called poke yoke function is thus provided. This therefore prevents assembly errors.

a tongue 114 which is designed to be connected electrically to the positive supply HV+ of the electronic converter. The connection is formed by electric welding, copper on copper or aluminium on aluminium.

Bus Bar with Negative Polarity

The negative bus bar 12 is also illustrated in FIG. 3.

In the non-limiting example illustrated, the negative bus bar 12 comprises for each capacitor 200 which is designed to be assembled by the device for assembling:

a second clearance orifice 122; and four second positioning orifices 121.

The second clearance orifice 122 has a diameter which is sufficient to allow a positive pin 202 of a capacitor 200 to pass through the said negative bus bar, such that when it reaches the negative bus bar 11 it is not liable to be in connection with the latter. This therefore prevents a risk of short-circuiting.

In a non-limiting embodiment illustrated in FIG. 3, the negative bus bar 12 comprises a second clearance orifice 122*a* which has the function of indexing the length of a first capacitor 202 of the assembly of capacitors 202. This orifice 122*a* comprises a diameter which is substantially smaller than the diameters of the other orifices 122.

The first capacitor and the second capacitor are at the two ends of the assembly of capacitors 200.

In a non-limiting embodiment illustrated in FIG. 3, the negative bus bar 12 comprises a second clearance orifice 122*b* which has the function of indexing the width of a second capacitor 202 of the assembly of capacitors 202. This orifice 122*b* has an oval form.

The second positioning orifices 121 make it possible to insert the negative pins 201 of a capacitor correctly in the negative bus bar 12, and thus to be electrically connected to the negative bus bar 12 by means of welding. Welding is carried out generally using tin between the negative pins and these orifices 121. These second orifices 121 can have slight fitting play in comparison with the diameter of a negative pin 201.

It will be noted that the supply lugs 120 are negative supply lugs forming a negative electrode, which make it possible to be connected to a pad on the PCB board of each arm of an electronic converter 300. The connection is also carried out using the technique of brazing by electric reflow known as BRE. According to a non-limiting embodiment, the BRE technique uses an under-layer of nickel and tinning, which prevents oxidation during the powerful heating when the welding is carried out.

The negative bus bar 12 also comprises:

a tongue 124 which is designed to be connected electrically to the negative supply of the electronic converter. The connection is formed by electric welding copper on copper or aluminium on aluminium;

a clearance 125 in order to receive a flow of electrical insulation in receptacles 501 of a vessel 500, so as to render the capacitors 200 integral with the said vessel 500, in which vessel the assembly of the electronic converter 300 will be arranged, i.e. the device 100 for assembling, the capacitors 200, and the printed circuit PCB. In a non-limiting example, the electric insulation is a resin, for example made of polyurethane or silicon. This makes it possible to fill the gap which exists between the capacitors 200 and the base of the receptacles 501 (illustrated in FIG. 6) when the capacitor block, i.e. the device 100 for assembling and the capacitors is fitted in the vessel 500. This therefore immobilises the assembly of the device for assembling and therefore prevents the assembly from being subjected to vibrations. In addition, this prevents the welding of the bus bars from being subjected to mechanical stresses. This clearance also makes it possible to limit the quantity of resin injected in comparison with another embodiment in which the vessel 500 itself comprises a clearance on its periphery in order to receive the resin.

In a non-limiting embodiment, the negative bus bar 12 additionally comprises a polarisation function 126 which is ensured by asymmetry of form and in particular by a polarisation cut-out, in order to ensure the installation in the correct location of the negative bus bar 12 on the support part 13, i.e. below the said support part, and not above in the place of the positive bus bar 11. The so-called poke yoke function is thus provided. This therefore prevents assembly errors.

In a non-limiting embodiment, the bus bar with positive polarity 11 comprises a width L1 smaller than the width L2 of the bus bar with negative polarity 12. The width of the positive bus bar 11 will be large enough for the current to be able to pass through the said bus bar.

Support Part for Insulation and Indexing

It will be noted that when they are superimposed on one another, the positive bus bar 11 and the negative bus bar 12 have an insulation space E such that there is no electrical contact between the two bus bars. This empty space E is obtained by means of the difference in length between the lugs 110 of the positive bus bar 11 and the lugs 120 of the negative bus bar 12, or by means of braces which are arranged between the two bus bars, and remain there either whilst the device for assembling is being fitted, or permanently, or it is obtained by means of the difference in length between the positive pins 202 and the negative pins 201 of the capacitors when the latter are welded.

However, when the welding is carried out subsequently on the supply lugs for example, there is a risk that the two bus bars may touch one another when the lugs are pressed in order to carry out the said welding. This gives rise to a short-circuit. The same applies when the two bus bars 11 and 12 are fitted in the vessel 500. If excessive pressure is applied during the fitting, there is a risk that the two bus bars will touch one another, thus creating a short-circuit.

Therefore, in a second non-limiting embodiment illustrated in FIG. 1*b*, the device 100 for assembling additionally comprises a support part for insulation and indexing 13, which is arranged between the said bus bar with positive polarity 11 and the said bus bar with negative polarity 12, the said support part 13 comprising:

at least a first part 130 for indexing of the said support part 13 with the bus bar with negative polarity 12;

at least one clearance orifice 131 which is designed to allow a negative pin 201 of a capacitor 200 to pass through the said support part 13 without electrical contact.

Figure 4:
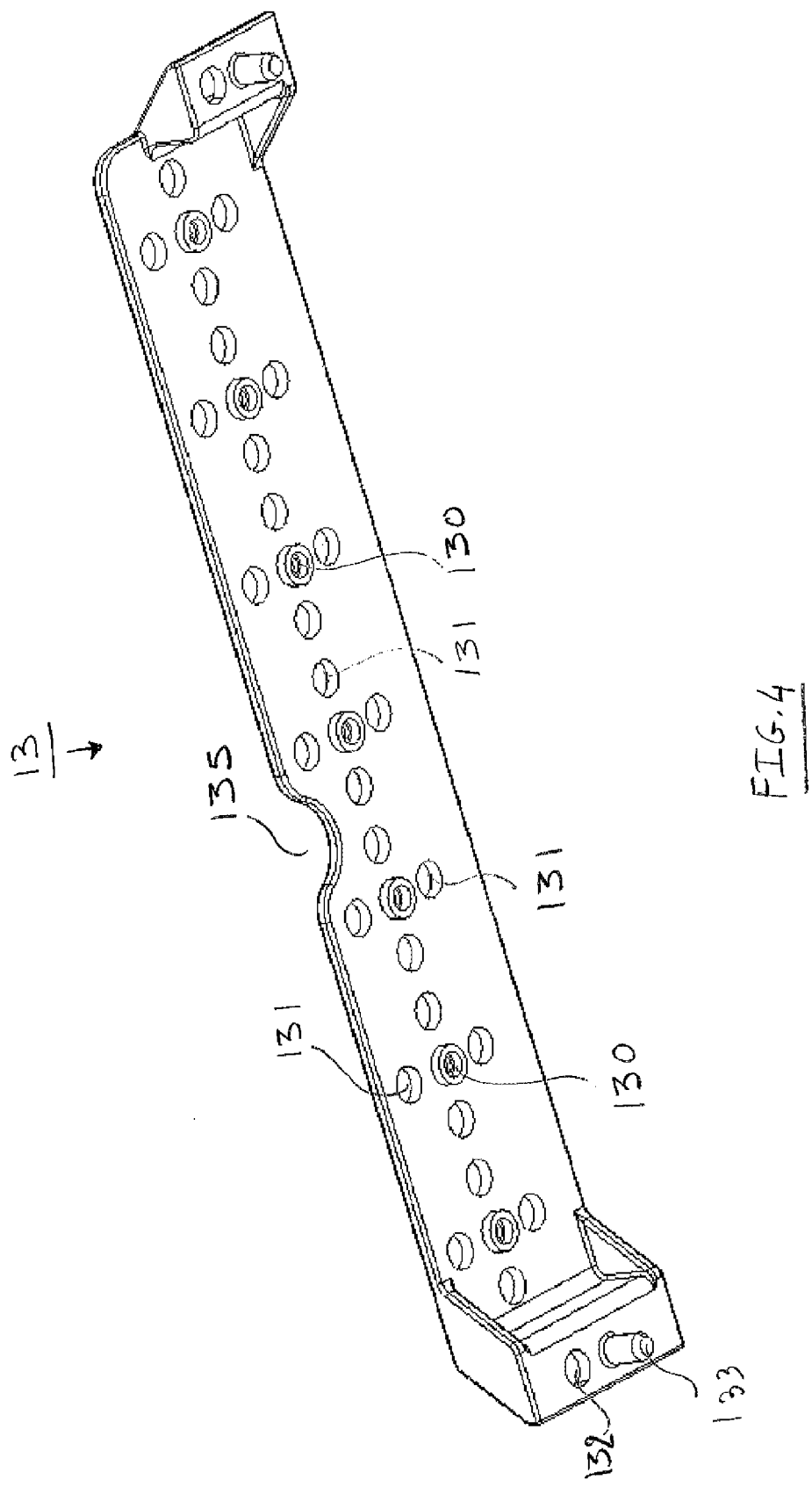
FIG. 4 represents a view in perspective of a support part for indexing and positioning of the device for assembling in FIG. 1b.

The support part for insulation and indexing 13 also illustrated in FIG. 4 is formed from a composite material formed from PBT plastic material (polybutylene terephthalate or butylene polyterephthalate) filled with glass fibres. This material makes it possible to obtain good mechanical characteristics and resistance to high temperatures. This therefore makes it possible to provide the installation function between the two bus bars 11 and 12. In a non-limiting example, it may be filled with between 15% and 30% glass fibres.

The first indexing part 130 is used in order to position the support part 13 correctly relative to the negative bus bar 12. The indexing part 130 is a part with a cylindrical form, the diameter of which is designed to fit in the three clearance orifices 122 in the negative bus bar 12. Thus, the support part 13 comprises as many indexing parts 130 as there are clearance orifices 122 in the negative bus bar 12, i.e. as many parts as there are capacitors 200.

The clearance orifice 131 has a diameter which is large enough to prevent any contact with a negative pin 201 of a capacitor 200, such as to allow the negative pin 201 to pass through in the case when the latter is longer than the thickness of the negative bus bar 12. In the example illustrated, the support part comprises four clearance orifices 131 for each capacitor 200.

Thus, this clearance orifice 131 permits access to a negative pin 201, and therefore forms a clearance to receive a welding meniscus during the welding of the said pin.

According to a non-limiting embodiment, the diameter of the clearance orifices 131 is identical to the diameter of the clearance orifices 112 of the positive bus bar 11, in order to facilitate the welding of the negative pins.

It will be appreciated that it would also be possible to use a brace between the two bus bars 11 and 12 in order to provide the insulation function.

The securing orifice 132 and the second indexing part 133 are used in order to position the assembly of the device 100 for assembling in the vessel. The indexing part 133 ensures accurate positioning of the support part 13 in the vessel 500. In the example illustrated, the indexing part is a positioning pin. The securing orifice 132 makes it possible to receive mechanically securing means such as a screw for example.

Figure 6:
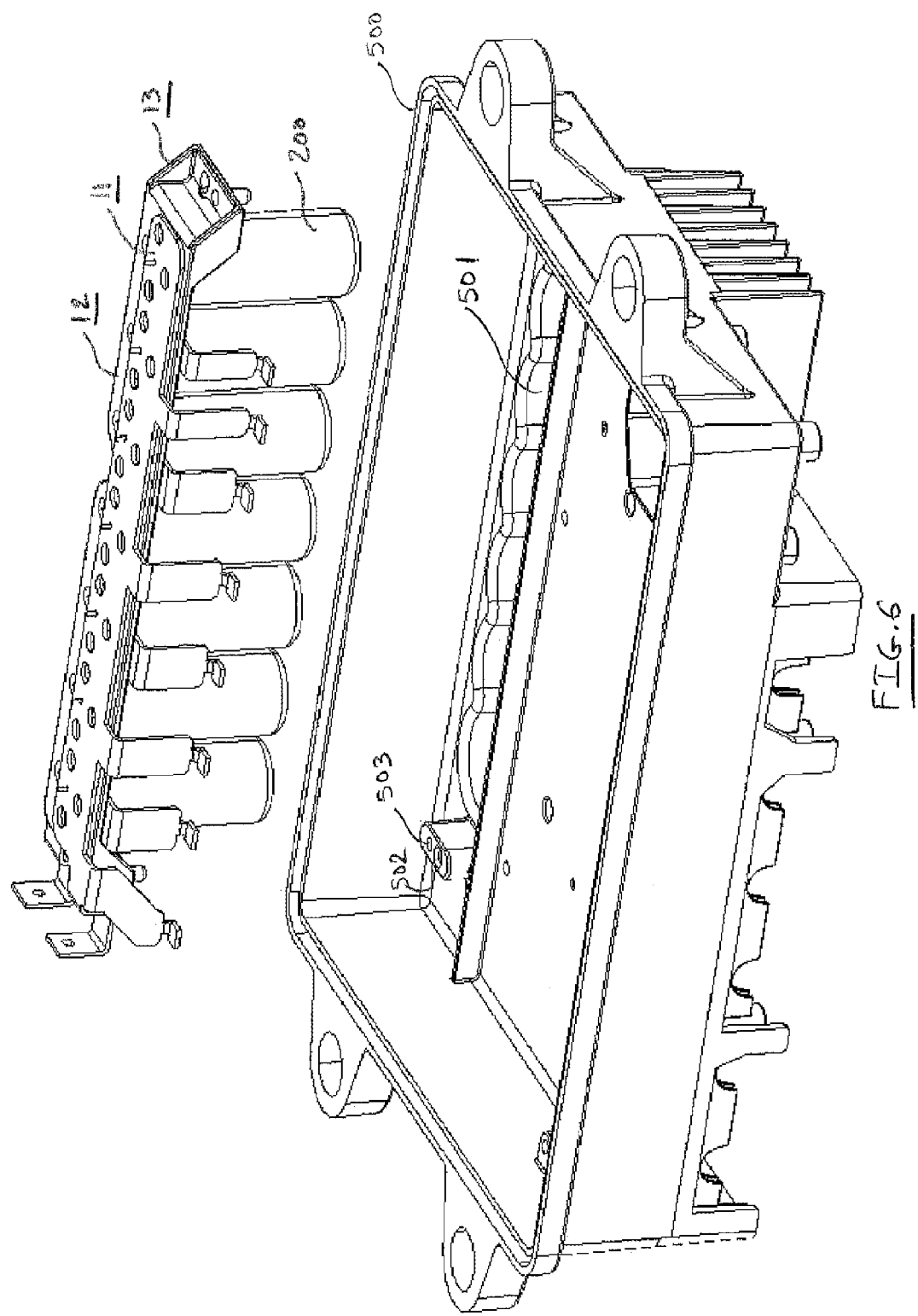
FIG. 6 represents an exploded view in perspective of the device for assembling illustrated in FIG. 5b and of a receipt vessel of the said device for assembling.

As can be seen in FIG. 6, the vessel 500 comprises an indexing orifice 503 corresponding to the indexing part 133, in which the said part 133 will be inserted. In addition, the vessel 500 comprises a securing orifice 502 corresponding to the orifice 132 for securing of the support part 13, into which a screw can be introduced.

According to a non-limiting embodiment, the support part for insulation and indexing 13 additionally comprises a clearance 135 to receive a flow of electrical insulation in the receptacles 501 in the vessel 500, such as to render the capacitors 200 integral with the said vessel 500.

In a non-limiting example, the electrical insulator is a resin. This clearance 135 has the same function as the clearance 125 of the negative bus bar previously described.

Thus, the fitting of the elements of the device 100 for assembling comprises the steps of:

positioning the negative bus bar 12 and the capacitors 200 by means of the first positioning orifices 111 in which the negative pins 201 of the capacitors are inserted. The positioning is carried out either by positioning the capacitors 201 one by one on the bus bar 12, or by positioning the bus bar 12 on the capacitors 200 which are pre-aligned by means of a template.

welding the negative pins 201 of the capacitors 200 onto the negative bus bar 12. It will be noted that this welding can be carried out after having assembled the positive bus bar 11.

positioning the support part for insulation and indexing 13 on the negative bus bar 12 by means of the indexing parts 130 which are inserted in the second clearance orifices 122, in the case when the support part 13 is used;

positioning the positive bus bar 11 on the support part for insulation and indexing 13 by means of first positioning orifices 111 into which the positive pins 202 are inserted;

welding the positive pins 202 of the capacitors 200 onto the positive bus bar 11.

It will be noted that the electric welding of the pins of the capacitors can be carried out by laser welding, which makes it possible to obtain a tapered edge on a pin. It is also possible to carry out complementary tinning, or not to carry out this tinning.

When the assembly of the device 100 for assembling and capacitors is assembled, the assembly known as the capacitor block is fitted in the vessel 500.

Figure 5A:
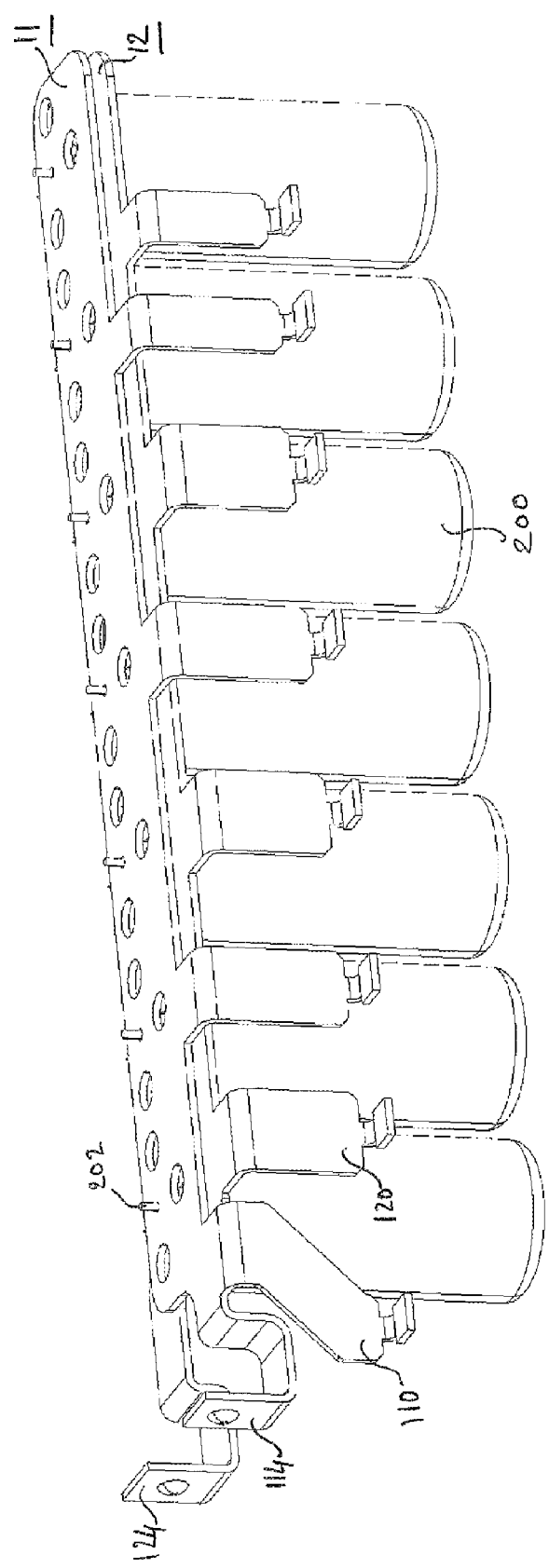

FIG. 5a illustrates the assembly of the parts of the device for assembling fitted with the capacitors 200 according to the first embodiment of the device 100 for assembling without a support part 13.

Figure 5B:
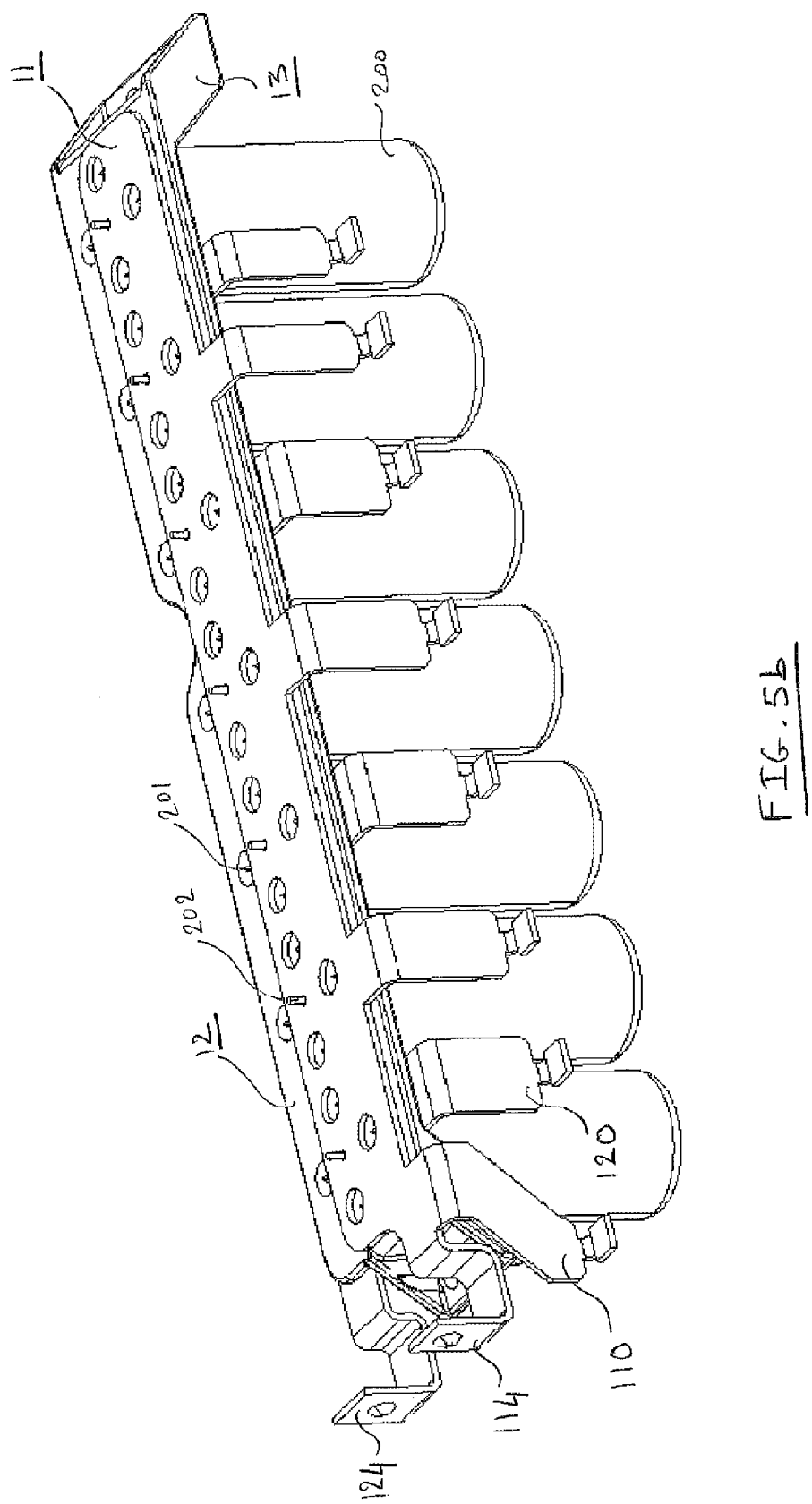
FIG. 5b represents an assembled view of the device for assembling illustrated in FIG. 1b.

FIG. 5b illustrates the assembly of the parts of the device for assembling fitted with the capacitors 200 according to the second embodiment of the device 100 for assembling with a support part 13.

As previously described, the device 100 for assembling makes it possible to assemble capacitors 200 for an electronic converter 300. As illustrated in FIG. 6, the device 100 for assembling is arranged in a vessel 500 which comprises:

receptacles 501 to receive the assembled capacitors 200. These receptacles have a cylindrical form in order to receive the cylindrical capacitors, and have a diameter which is substantially larger than the diameter of the capacitors, such as to have play;

an indexing orifice 503 corresponding to the indexing part 133 into which the said part 133 will be inserted;

a securing orifice 502 corresponding to the securing orifice 132 of the support part 13 into which a screw can be introduced.

It will be noted that the indexing part 133 makes it possible to ensure accurate positioning of the capacitors 200 in their respective receptacle 501. The capacitors 200 are thus concentric relative to the cylindrical receptacles 501. Thus, the capacitors 200 do not touch the vessel 500 during the fitting, and will therefore not be subjected to stress. There is therefore no risk of damaging the said capacitors.

Electronic Converter

Figure 7:
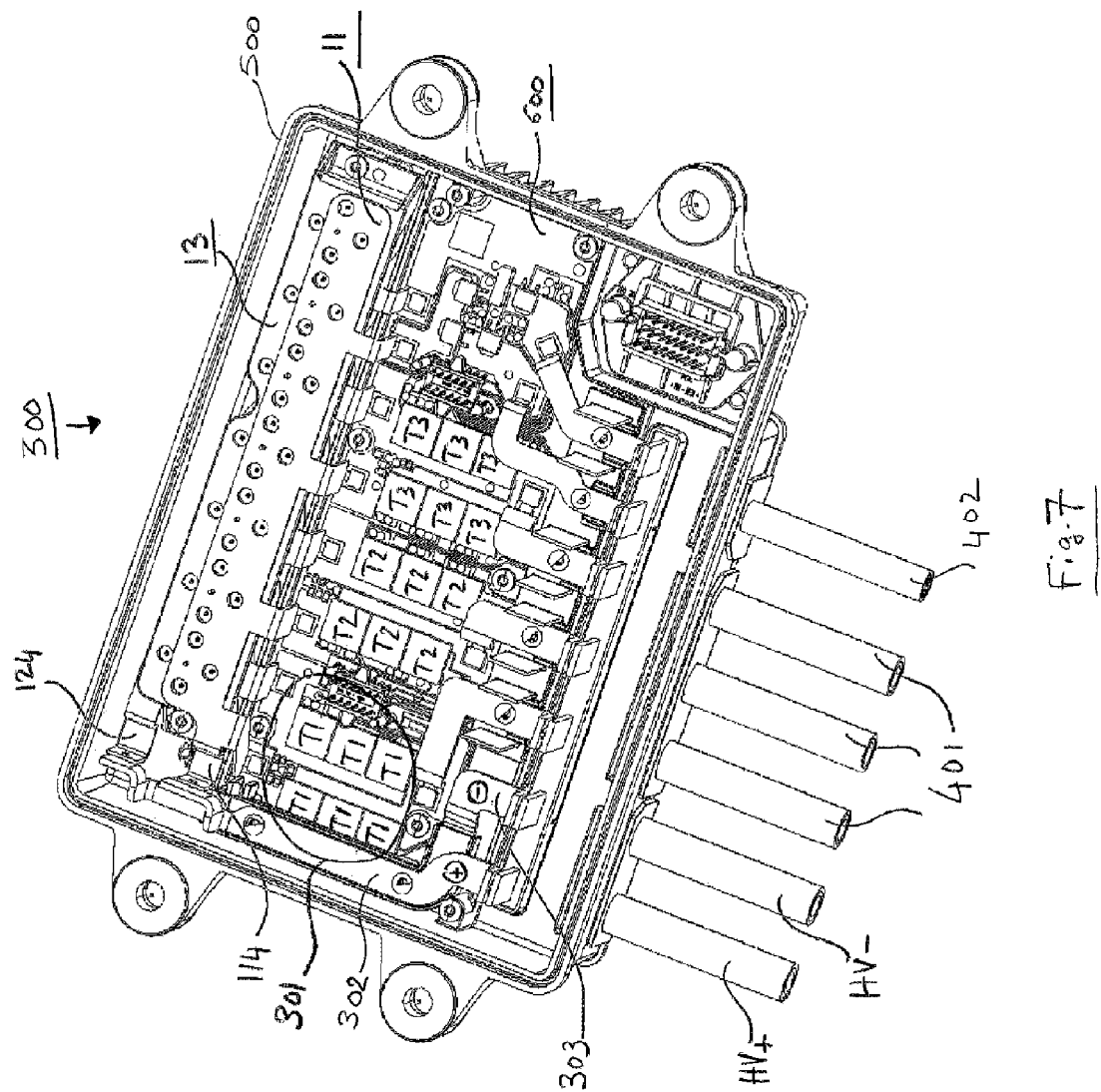
FIG. 7 represents an assembled plan view of the device for assembling in FIG. 5b in the vessel in FIG. 6 and of the printed circuit board of an electronic converter.

The vessel 500 also makes it possible to receive the printed circuit board PCB of the electronic converter 300 comprising the integrated circuit, the discrete components, and the transistors T, in other words as illustrated in FIG. 7. In a non-limiting example, the transistors T are MOSFETs.

Thus, an electronic converter 300 comprises:

the device 100 for assembling previously described;

the plurality of capacitors 200 designed to be assembled by the device 100 for assembling;

a printed circuit board which 600 forms the electric circuit of the said electronic converter 300, the said printed circuit board comprising the plurality of arms 301 provided with transistors T.

In the non-limiting example illustrated, the electronic converter 300 comprises three arms 301, each arm comprising a series of transistors T. Thus, as illustrated in FIG. 7, the first arm 301 comprises six transistors T1, the second arm comprises six transistors T2, and the third arm comprises six transistors T3.

The transistors T, the discrete components and the integrated circuit which form the electronic converter are fitted on a PCB board 600. The latter also comprises on its periphery supply tracks 302 and 303 and phase tracks 401a, 401b, 401c.

Each arm 301 is supplied with positive HV+ and negative HV− voltage by means of the positive supply track 302 and the negative supply track 303, which are welded respectively on the arm 114 of the positive bus bar 11 of the device 100 for assembling and on the arm 124 of the negative bus bar 12 of the device 100 for assembling.

In addition, as can be seen in FIG. 7, the supply lugs 110 and 120 of the positive and negative bus bars are welded respectively onto the positive and negative electrodes of the different arms of transistors T.

It will be noted that, within the context of the motor vehicle application, the electronic converter 300 makes it possible to filter the current of an electrical machine 400. In a non-limiting embodiment, the electrical machine is a reversible machine such as an alternator-starter of a motor vehicle, the said machine having power of approximately 10 kW.

The functions of the machine are recuperative breaking, engine torque assistance, or also a function of stopping and automatic restarting of the engine of the motor vehicle.

Figure 8:
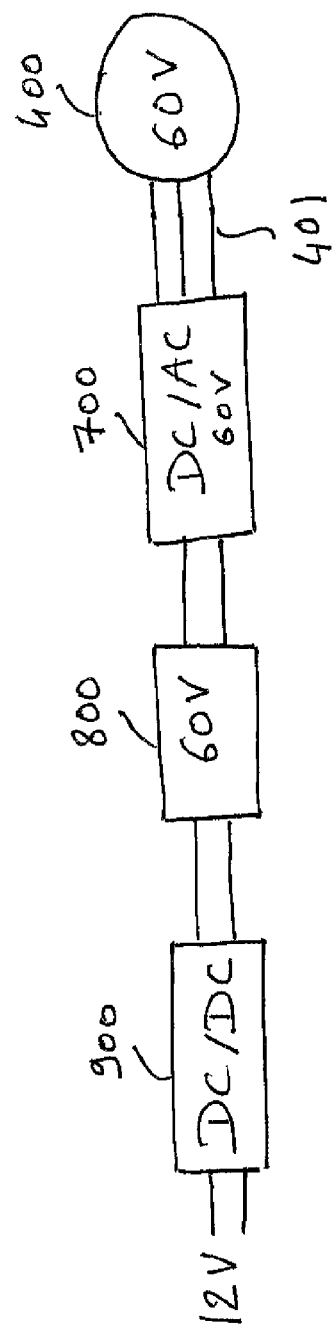
FIG. 8 represents a simplified diagram of an electronic converter comprising a device for assembling according to FIGS. 1 to 7 within the context of an electrical machine application.

As illustrated in the simplified electrical diagram in FIG. 8, the electrical machine 400 is a three-phase machine supplied by a voltage of 60 V for example, and connected to an inverter 700 which is a DC/AC converter. The latter is itself connected to a battery 800 of the vehicle, which is supplied with 60 V. Finally, a DC/DC voltage converter 900 is connected to the battery 800 of the vehicle, and makes it possible to convert the 60 V voltage into a 12 V voltage, the latter making it possible to supply the motor vehicle network.

In a first embodiment, the electronic converter 300 is connected to the electrical machine 400. More particularly, each arm 301 of the electronic converter 300 is connected to each phase 401 of the electrical machine as illustrated in FIG. 7. The electronic converter is thus the DC/AC reversible inverter, which makes it possible to transform a three-phase voltage into direct voltage.

In a second non-limiting embodiment, the electronic converter 300 is the two-way DC/DC converter, which makes it possible to transform the 60 V battery voltage into a 12 V motor vehicle supply voltage network.

It will be appreciated that the device for assembling is not limited to the application of an electronic converter for a motor vehicle, but can be used in any electronic housing which serves the purpose of filtering the current, and therefore uses filtering capacitors.

In addition, the device for assembling is not limited to the embodiment previously described. Thus, the device for assembling can be designed such as to be able to use soldering stars capacitors with three negative pins arranged at 120° relative to one another. It can also be designed such as to be able to use capacitors with a single negative pin.

Thus, the present invention has the following additional advantages:
it makes it possible to reduce the inductance of the electronic converter, with the current no longer passing through the PCB board of the converter;
it makes it possible to reduce the weight of the PCB board of the converter, since the latter no longer bears the weight of the capacitors;
it makes it possible to reduce the surface area of the PCB board of the converter, since it no longer needs to contain the electric tracks to make the current pass through;
it makes it possible to position the assembly of the device 100 for assembling in the vessel 500 by means of the support part 13;
it permits indexing of the negative bus bar 12 by means of the support part 13;
it makes it possible to reduce the cost of the positive bus bar 11, since its width is smaller than that of the negative bus bar 12;
it makes it possible to avoid using conductive tracks which pass along the PCB board, and therefore avoids passage of the current through copper-plated tracks of this type;
it makes it possible to ensure accurate positioning of the capacitors 200 in their respective receptacle 501 by means of the part 133 for indexing of the support part 13. The capacitors 200 are thus concentric relative to the cylindrical receptacles 501, and do not touch the vessel 500 during functioning. This therefore prevents parasitic EMC effects during functioning. In fact, in general the vessel 500 is fitted on the body of the motor vehicle which earths the 12 V network of the vehicle. On the other hand, the capacitors are connected to the earth HV− via which the currents obtained from the 60 V supply voltage pass.

The invention claimed is:

1. Device (100) for assembling capacitors (200) for an electronic converter (300), comprising a plurality of arms (301) provided with transistors (T), said device (100) for assembling comprising a bus bar with positive polarity (11) comprising a plurality of supply lugs (110), each supply lug being designed to be connected to a positive electrode of each arm (301) of said electronic converter (300), and a bus bar with negative polarity (12) comprising a plurality of supply lugs (120), each supply lug being designed to be connected to a negative electrode of each arm (301) of said electronic converter (300), the bus bar with positive polarity (11) and the bus bar with negative polarity (12) being superimposed on one another without electrical contact, wherein
the bus bar with positive polarity (11) also comprises:
at least a first positioning orifice (111) which is designed to receive a positive pin (202) of a capacitor (200), and is designed to provide an electrical connection with said positive pin (202); and
at least a first clearance orifice (112) which is designed to allow a negative pin (201) of a capacitor (200) to pass through said bus bar with positive polarity (11) without electrical contact;
the bus bar with negative polarity (12) also comprises:
a second clearance orifice (122) which is designed to allow a positive pin (202) of a capacitor (200) to pass through said bus bar with negative polarity (12) without electrical contact;
at least a second positioning orifice (121) which is designed to receive a negative pin (201) of a capacitor (200), and is designed to provide an electrical connection with said negative pin (201); and
in that the device additionally comprises a support part for insulation and indexing (13) which is arranged between said bus bar with positive polarity (11) and said bus bar with negative polarity (12), said support part (13) comprising:
at least a first part (130) for indexing of said support part (13) with the bus bar with negative polarity (12); and at least one clearance orifice (131) which is designed to allow a negative pin (201) of a capacitor (200) to pass through said support part (13) without electrical contact.

2. Device (100) according to claim 1, wherein the bus bar with positive polarity (11) comprises a width (L1) which is smaller than the width (L2) of the bus bar with negative polarity (12).

3. Device (100) according to claim 2, wherein the device (100) for assembling is designed to be arranged in a vessel (500), and wherein the support part for insulation and indexing (13) additionally comprises:
- a second part (133) for indexing of said device (100) for assembling with said vessel (500);
- an orifice (132) for securing of said device (100) for assembling in said vessel (500).

4. Device (100) according to claim 3, wherein the bus bar with negative polarity (12) and the support part for insulation and indexing (13) comprise a clearance (125, 135) in order to receive a flow of electrical insulation in receptacles (501) in the vessel (500), such as to render the capacitors (200) integral with said vessel (500).

5. Device (100) according to claim 1, wherein the bus bar with negative polarity (12) additionally comprises a polarisation function (126), in order to ensure the installation of the bus bar with negative polarity (12) on the support part for insulation and indexing (13).

6. Device (100) according to claim 1, wherein the support part for insulation and indexing (13) is formed by a composite material formed from PBT plastic material filled with glass fibre.

7. Electronic converter (300) comprising a plurality of arms (301) provided with transistors (T), according to which the electronic converter comprises:
- a device (100) for assembling according to claim 1;
- a plurality of capacitors (200) designed to be assembled by the device (100) for assembling;
- a printed circuit board (600) which forms the electric circuit of said electronic converter (300), said printed circuit board (600) comprising the plurality of arms provided with transistors.

8. Electronic converter (300) according to claim 7, wherein said converter being an inverter for an electrical machine (400).

9. Electronic converter (300) according to claim 7, wherein said converter being a two-way DC/DC converter.1.

10. Device (100) according to claim 2, wherein the bus bar with negative polarity (12) additionally comprises a polarisation function (126), in order to ensure the installation of the bus bar with negative polarity (12) on the support part for insulation and indexing (13).

11. Device (100) according to claim 3, wherein the bus bar with negative polarity (12) additionally comprises a polarisation function (126), in order to ensure the installation of the bus bar with negative polarity (12) on the support part for insulation and indexing (13).

12. Device (100) according to claim 4, wherein the bus bar with negative polarity (12) additionally comprises a polarisation function (126), in order to ensure the installation of the bus bar with negative polarity (12) on the support part for insulation and indexing (13).

13. Device (100) according to claim 2, wherein the support part for insulation and indexing (13) is formed by a composite material formed from PBT plastic material filled with glass fibre.

14. Device (100) according to claim 3, wherein the support part for insulation and indexing (13) is formed by a composite material formed from PBT plastic material filled with glass fibre.

15. Device (100) according to claim 4, wherein the support part for insulation and indexing (13) is formed by a composite material formed from PBT plastic material filled with glass fibre.

16. Device (100) according to claim 5, wherein the support part for insulation and indexing (13) is formed by a composite material formed from PBT plastic material filled with glass fibre.

17. Electronic converter (300) comprising a plurality of arms (301) provided with transistors (T), according to which the electronic converter comprises:
- a device (100) for assembling according to claim 2;
- a plurality of capacitors (200) designed to be assembled by the device (100) for assembling;
- a printed circuit board (600) which forms the electric circuit of said electronic converter (300), said printed circuit board (600) comprising the plurality of arms provided with transistors.

18. Electronic converter (300) comprising a plurality of arms (301) provided with transistors (T), according to which the electronic converter comprises:
- a device (100) for assembling according to claim 3;
- a plurality of capacitors (200) designed to be assembled by the device (100) for assembling;
- a printed circuit board (600) which forms the electric circuit of said electronic converter (300), said printed circuit board (600) comprising the plurality of arms provided with transistors.

19. Electronic converter (300) comprising a plurality of arms (301) provided with transistors (T), according to which the electronic converter comprises:
- a device (100) for assembling according to claim 4;
- a plurality of capacitors (200) designed to be assembled by the device (100) for assembling;
- a printed circuit board (600) which forms the electric circuit of said electronic converter (300), said printed circuit board (600) comprising the plurality of arms provided with transistors.

20. Electronic converter (300) comprising a plurality of arms (301) provided with transistors (T), according to which the electronic converter comprises:
- a device (100) for assembling according to claim 5;
- a plurality of capacitors (200) designed to be assembled by the device (100) for assembling;
- a printed circuit board (600) which forms the electric circuit of said electronic converter (300), said printed circuit board (600) comprising the plurality of arms provided with transistors.

21. Electronic converter (300) comprising a plurality of arms (301) provided with transistors (T), according to which the electronic converter comprises:
- a device (100) for assembling according to claim 6;
- a plurality of capacitors (200) designed to be assembled by the device (100) for assembling;
- a printed circuit board (600) which forms the electric circuit of said electronic converter (300), said printed circuit board (600) comprising the plurality of arms provided with transistors.

* * * * *